Figure 1:
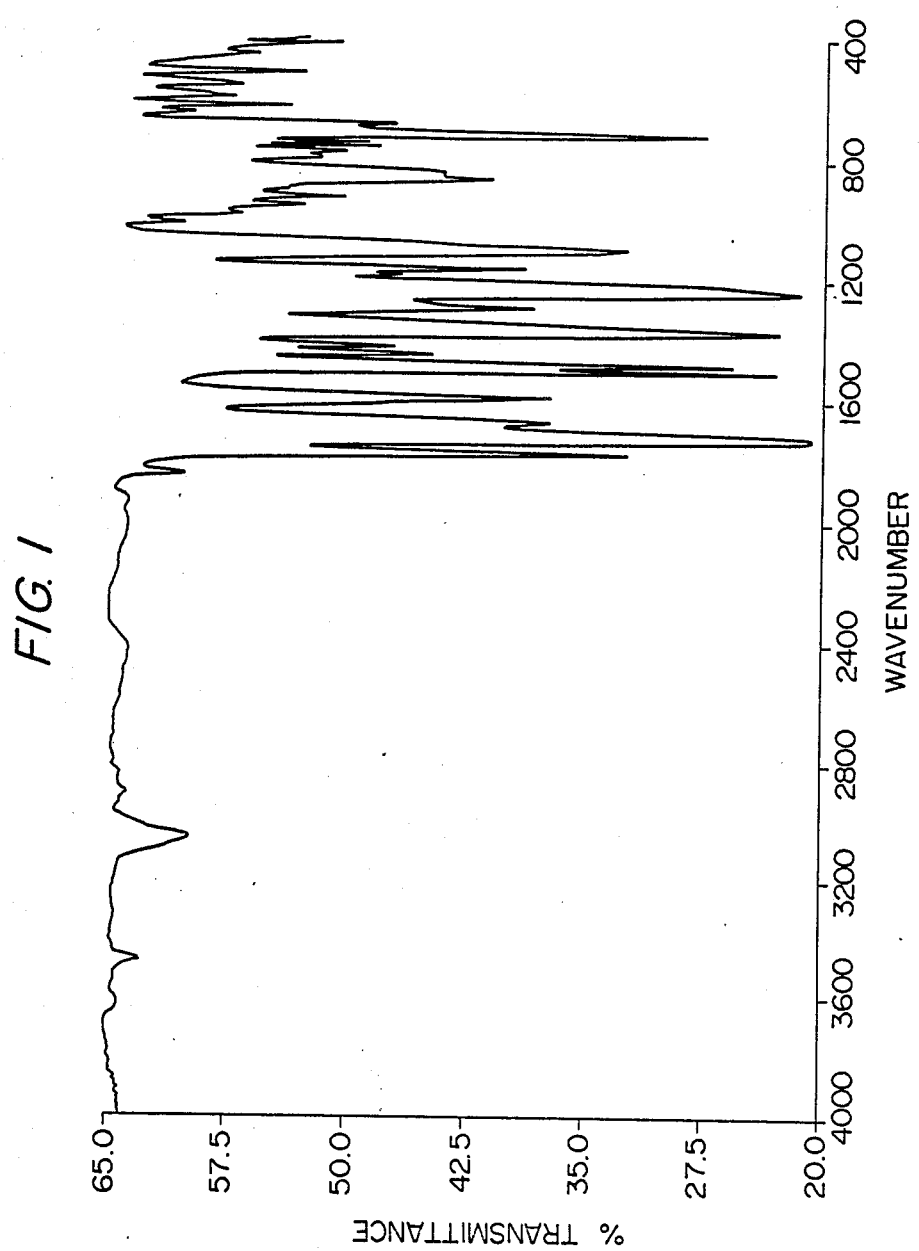
Figure 2:
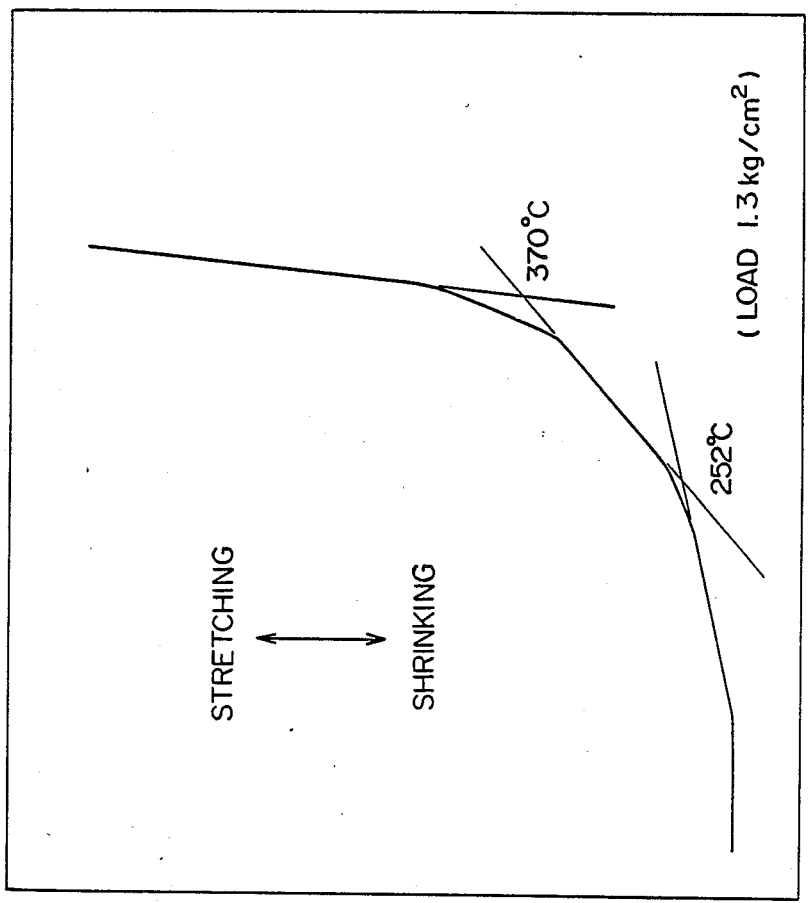
Figure 3:
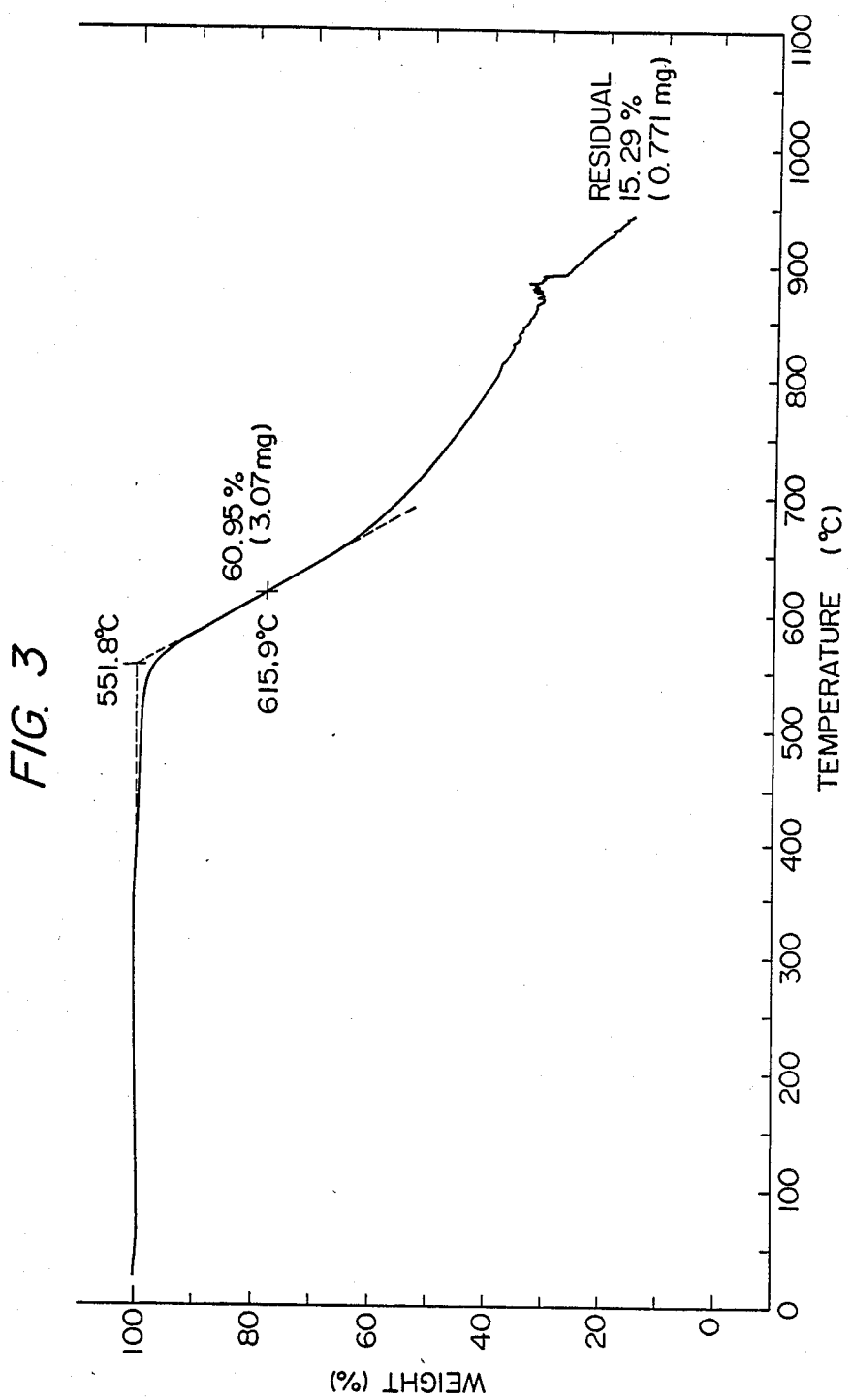

United States Patent [19]

Hara et al.

[11] Patent Number: 4,902,740

[45] Date of Patent: Feb. 20, 1990

[54] POLYAMIDEIMIDES CONTAINING 3,4'-DIAMINO-DIPHENYLETHER AS DIAMINE COMPONENT, WITH PLASTICIZER

[75] Inventors: Shigeyoshi Hara; Hiroo Inata; Shunichi Matsumura, all of Iwakuni, Japan

[73] Assignee: Teijin Limited, Osaka, Japan

[21] Appl. No.: 268,479

[22] Filed: Nov. 8, 1988

Related U.S. Application Data

[63] Continuation-in-part of Ser. No. 888,524, Jul. 23, 1986, abandoned.

[30] Foreign Application Priority Data

Jul. 26, 1985 [JP] Japan .................. 60-163864
Sep. 18, 1985 [JP] Japan .................. 60-204321
Jul. 6, 1988 [JP] Japan .................. 63-166859

[51] Int. Cl.⁴ ............... C08L 67/00; C08L 73/00; C08L 77/00; C08L 79/00
[52] U.S. Cl. .................. 524/600; 528/179; 528/182; 528/351; 528/125; 528/128; 528/172; 528/173; 528/185; 528/188; 528/189; 528/220; 528/229; 528/352; 528/353
[58] Field of Search .......... 528/351, 179, 182; 524/600

[56] References Cited

U.S. PATENT DOCUMENTS 3,829,399 8/1974 Hara et al. .................. 524/600
3,860,559 1/1975 Minami et al. .................. 528/182

OTHER PUBLICATIONS

Chemical Abstracts, vol. 85, No. 18, 1st Nov. 1976, p. 52, col. 1, Abstract No. 125094v.

Primary Examiner—John Kight
Assistant Examiner—Frederick Krass
Attorney, Agent, or Firm—Sherman & Shalloway

[57] ABSTRACT

A polyamideimide having an inherent viscosity of above 0.48 which comprises a unit of the following formula (II)

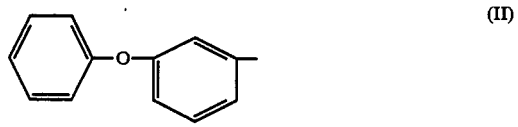

(II)

and a unit of the following formula (IV)

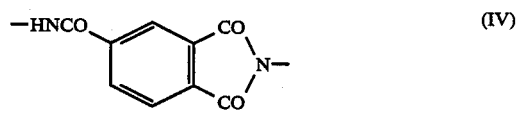

(IV)

as main units forming the molecular chains of the polyamideimide, and an intimate mixture of the polyamideimide and a plasticizing material for the polyamideimide.

10 Claims, 3 Drawing Sheets

POLYAMIDEIMIDES CONTAINING 3,4'-DIAMINO-DIPHENYLETHER AS DIAMINE COMPONENT, WITH PLASTICIZER

This application is an continuation-in-part application of Ser. No. 888,524 filed on July 23, 1986 now abandoned.

This invention relates to polyamideimides having a high molecular weight obtained by using 3,4'-diaminodiphenylether as a diamine component, and novel process for preparing the same.

Aromatic polyamideimides containing an aromatic tricarboxylic acid or an aromatic tricarboxylic acid anhydride as an acid component have been known heretofore.

Japanese Laid-Open Patent Publication (Kokai) No. 180532/1983 discloses a process for producing an aromatic polyamideimide from the aforesaid acid component and an aromatic diamine in the presence of a dehydration catalyst using a solvent containing sulfolane. Example 4 of this patent document describes that 20 g (0.1 mle) of 3,4'-diaminodiphenylether and 19.2 g (0.1 mole) of trimellitic anhydride were polycondensed in a large amount of solvent (160 ml of sulfolane) to give pale yellow polyamideimide having a reduced viscosity of 1.056 dl/g in a yield of 97.6 %.

Japanese Laid-Open Patent Publications (Kokai) Nos. 160140/1984 and 42424/1985 and corresponding European Laid-Open Patent Application No. 119,719 disclose a radiation-sensitive composition characterized by comprising:

(1) a polymer containing recurring units (A) represented by the following formula:

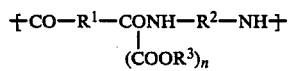

wherein $R^1$ is a trivalent or tetravalent aromatic or heteroaromatic residue having 6 to 30 carbon atoms, $R^2$ is a divalent aromatic or heteroaromatic residue having 6 to 30 carbon atoms, $R^3$ is a hydrogen atom or an ammonium ion, n is an integer of 1 or 2, and COOR3 is located in an ortho or peri position with respect to the amide linkage, (2) an organic compound having a radiation-dimerizable or radiation-polymerizable olefinic double bond and an amino radical or a quaternary ammonium salt, and (3) an aromatic secondary or tertiary amine compound which is chemically inactive with actinic radiation.

U.S. Pat. No. 3,829,399 discloses a polyamideimide precursors having a main chain an aromatic amideimide group expressed by the following formura (I)

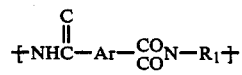

wherein Ar stands for an aromatic group and $R_1$ is a divalent organic radical.

However, this document fails to give any specific description of a polyamide-imide between trimellitic anhydride and 3,4'-diaminodiphenylether having a high molecular weight.

It is an object of this invention is to provide an intimate mixture of a polyamideimide containing 3,4'-diaminodiphenylether as a diamine component and trimellitic acid anhydride as an acid component and a plasticizing material for the polyamideimide.

Another object of this invention is to provide a process for producing an intimate mixture of the above composition shapable directly at relatively low temperatures as a reaction mixture after performing a polymerization reaction for the production of the above polyamideimide.

Still another object of this invention is to provide a novel process for producing a polyamideimide having a high molecular weight and a least branched molecule.

Further objects of this invention alone with its advantages will become apparent from the following description.

These objects and advantages of the invention are achieved by an intiate mixture comprising (A) a poyamideimide comprising a unit represented by the following formula (II)

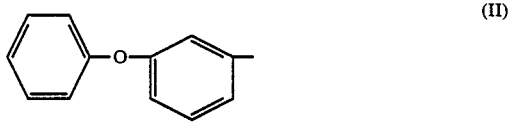

and a unit of the following formula (IV)

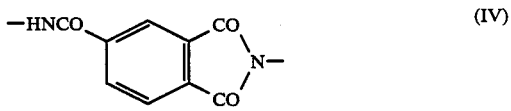

as main units forming the molecular chains of the polyamideimide, said polyamideimide having an inherent viscosity ($\eta_{inh}$, measured at 30° C. in N-methylpyrrolidone above 0.48, and (B) a plasticizing material for the polyamideimide (A), said plasticising material for the polyamideimide (A) being a diphenyl compound represented by the following formula

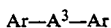

wherein $A^3$ is —O—, —SO$_2$—, —CO— or an alkylene group, and Ar is an aromatic radical.

In the polyamideimide (A) constituting the intimate mixture of this invention, the total proportion of the unit of formula (IV) and the unit of formula (II) is preferably at least 50 % based on the entire units forming the polyamideimide molecular chains. Especially preferably, the proportion of the unit of formula (IV) and the unit of formula (II) directly bonded to each other is at least 50 % based on the total proportion of the unit of formula (IV) and the unit of formula (II). Above all, it is preferred that the total proportion of the unit of formula (IV) and the unit of formula (II) directly bonded to each other be at least 50 % based on the entire units forming the polyamideimide molecular The polyamideimide (A) may comprise the units of formulae (IV) and (II) as main units and other minor units.

The minor other unit is at least one selected from the group consisting of a unit represented by the following formula (V)

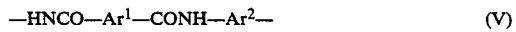

wherein Ar¹ and Ar² are identical or different and each represents a divalent aromatic group having 6 to 20 carbon atoms, a unit represented by the following formula (VI)

—Ar³—CONH— (VI)

wherein Ar³ is the same as defined for Ar¹, a unit represented by the following formula (VII)

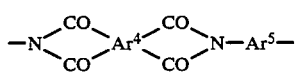
(VII)

wherein Ar⁴ represents a tetravalent aromatic group having 6 to 20 carbon atoms, and Ar⁵ is the same as Ar¹, and a unit represented by the following formula (VIII)

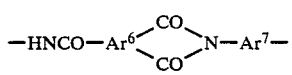
(VIII)

wherein Ar⁶ represents an aromatic group having 6 to 20 carbon atoms, and Ar⁷ is the same as defined for Ar¹, *provided that Ar⁷ is not a 3,4'-diphenyl ether group.*

These minor units are contained in a proportion smaller than the total proportion of the unit of formula (IV) and the unit of formula (II).

Examples of the aromatic groups having 6 to 20 carbon atoms represented by Ar¹ to Ar⁷ in formulae (V) to (VIII) are a benzene ring and 2 or 3 benzene rings bonded to each other directly or via carbon, oxygen, sulfur, etc. More specifically, groups of the following formulae are suitable.

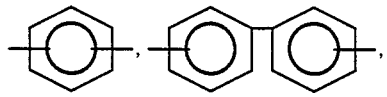

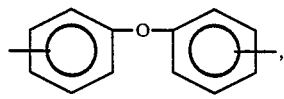

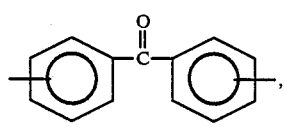

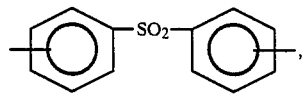

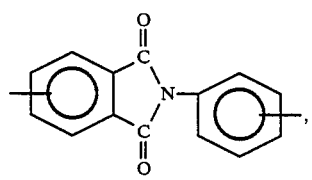

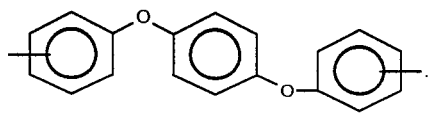

A polyamideimide having higher heat resistance can be formed, for example, by introducing the unit of formula (VII) in which Ar⁴ is

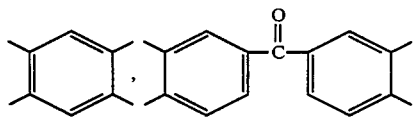

or

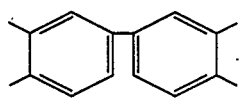

Polyamideimides having higher alkali resistance or mechanical properties can be formed, for example, by introducing the unit of formula (V) in which Ar¹ is

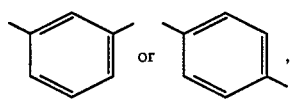

or the unit of formula (VI) in which Ar³ is

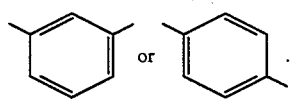

The unit of formula (VIII) in which Ar⁶ is

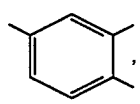

can also be introduced. Ar² in formula (V) and Ar⁵ in formula (VII) may be a 3,4'-diphenylether group

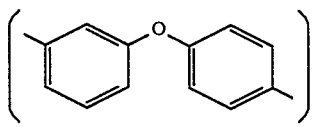

or another aromatic group, but Ar⁷ in formula (VIII) is an aromatic group other than 3,4'-diphenyl diphenyl ether group.

Such other aromatic groups are derived from diamines such as m-phenylenediamine, p-phenylenediamine, 4,4'-diaminodiphenylether, 3,3'-diaminodiphenylsulfone, 4,4'-diaminodiphenylsulfone, 3,3'-diaminobenzophenone, 4,4'-diaminobenzophenone, bis(m- or p-aminophenoxy)-1,3benzene and bis(m- or p-aminophenoxy)-1,4-benzene.

The above polyamideimide has an inherent viscosity [η$_{inh}$], measured at 30° C. in N-methylpyrrolidone, of above 0.48, preferably 0.55 to 1.5.

Polyamideimides which can be suitably used in this invention have a glass transition point of 150 to 300° C. The glass transition point is measured by the TMA penetration method.

The plasticizing material which constitutes the other component of the intimate mixture of this invention is a component which plasticizes the above polyamideimide. A low-molecular-weight diphenyl compound which has a boiling point of at least 300° C. and a molecular weight of not more than 1,000 and is compatible, but substantially non-reactive, with the polyamideimide, for examples, can be preferably used as the plasticizing material.

The diphenyl compounds are represented by the following formula

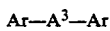

wherein A3 is —O—, —SO$_2$—, —CO— or an alkylene group, and Ar is an aromatic radical.

Examples of the alkylene grou for A3 in the formula are linear alkylene groups having 2 to 4 carbon atoms such as ethylene, trimethylene and tetramethylene. A$^3$ is preferably —O—, —SO$_2$ and —CO—.

Examples of the aromatic radical for Ar in the formula include a phenyl group, a naphthyl group, a 5,6,7,8-tetrahydro 2- or 3-naphthyl group and the groups

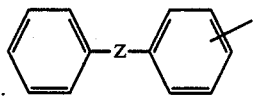

wherein Z is —O—, —SO$_2$— or —CH$_2$—. These groups may be substituted by substituents which are non-react ive with the Examples of the substituents are lower alkyl groups such as methyl and ethyl, lower alkoxy groups such as methoxy and ethoxy, halogen atoms such as chlorine and bromine, a nitro group, a phenyl gorup, a phenoxy group, a phenylphenoxy group and a cyclohexyl group which may be substituted by a methyl group.

Examples of the compounds represented by the formula include diphenylsulfone, 4,4'-diphenoxydiphenylsulfone, 4,4'-bis(4- or 3- or 3-chlorophenoxy)diphenylsulfone, 4,4'-bis(4- or 3- or 2-phenylphenoxy)diphenylsulfone, 4,4'-bis(4- or 3- or 2-t-butylphenoxy)diphenylsulfone, 4,4'-bis(4- or 3- or 2-octylphenoxy)diphenylsulfone, and 4,4'-bis(alpha- or beta-naphthyloxy)diphenylsulfone.

Of these compounds, diphenylsulfone is preferred.

The intimate mixture of this invention preferable contains the polyamideimide (A) in a proportion of 40 to 90 % by weight, more preferably 50 to 80 % by weight, especially preferably 60 to 80 % by weight, based on the total amount of the polyamideimide (A) and the plasticizing material (B).

The intimate mixture of this invention can be produced by thermally condensing an acid component composed mainly of trimellitic acid and/or trimellitic anhydride and a diamine component composed mainly of 3,4'-diaminodiphenyl ether and/or its lower aliphatic carboxylic acid amide in the presence of the plasticizer described above.

The plasticizer is used in such a proportion that the concentration of the resulting polymer is preferably at least 50 % by weight, more preferably at least 60 % by weight, especially preferably at least 70 % by weight.

The thermal condensation is carried out usually at 200° to 350° C., preferably 250° to 320°°C., especially preferably 260° to 310° C. Preferably, the thermal condensation is carried out under atmospheric pressure to elevated pressure, and as required, under such reduced pressures as not to cause evaporation of the plasticizing material. It is carried out in an atmosphere of an inert gas such as nitrogen or argon.

The thermal condensation reaction is desirably carried out in the presence of a small amount of a catalyst for promoting the reaction between the aromatic amino group and the carboxyl group, such as phosphorus compounds, boron compounds, or heteropolyacids. Examples of the phosphorus compounds are trimethyl phosphite, triethyl phosphite, triphenyl phosphite, phosphoric acid, triphenylphosphine, polyphosphoric acid, phosphoric acid, phosphorous acid and hypophosphorous acid. Boric acid is an example of the boron.

There can also be used a condensing agent which participates in the condensation reaction between the aromatic amino acid and the carboxyl group and itself changes to promote the amide-forming reaction. Examples of the condensing agent are a combination of triphenylphosphine and pyridine, diphenyl sulfite, diphenyl carbonate, diaryl esters of dicarboxylic acids such as diphenyl terephthalate, and compounds represented by the following formula

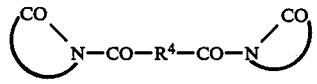

wherein R$^4$ represents an aromatic group having 6 to 20 carbon atoms, aliphatic groups having 2 to 10 carbon atoms, or a bond, and the two lactam rings are 5- to 7-membered, such as

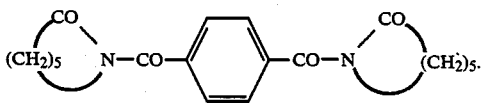

Water formed as a result of the thermal condensation reaction is removed out of the reaction system. The condensing agent is preferably added in such an amount that after removing water formed as a result of imidization, it induces reaction of the 4-carboxyl group of the trimellitic acid residue with all remaining amino groups.

According to this invention, the polyamideimide is obtained as an intimate mixture with a plasticizing material therefor. This intimate mixture is characterized by being shapable at temperature considerably lower, for example about 100° C. lower than the temperature at which the polyamideimide alone can be shaped. The plasticizing material can be removed by the treating shaped article or if required, small masses of the product before shaping with a solvent capable of dissolving the plasticized product but incapable of dissolving the polyamideimide.

Examples of preferred solvents used for this purpose include aromatic hydrocarbons, halogenated aliphatic hydrocarbons, aliphatic ketones, aliphatic esters, and cyclic ethers. Specific examples are toluene, xylene, methylene chloride, chloroform, acetone, methyl ethyl ketone, methyl acetate, ethyl acetate and dioxane.

The polyamideimide constituting the intimate mixture of the invention obtained as above has an inherent viscosity, measured at 30° C. in N-methylpyrrolidone, of above 0.48.

Investigations of the present inventors have shown that the polyamideimide having a relatively high inherent viscosity can be produced by any of the following processes (1), (2) and (3).

(1) A process which comprises thermally condensing an acid component mainly comprising a member selected from the group consisting of trimellitic acid, trimellitic anhydride and a mixture of these, and a diamine component of the following formula (IX)

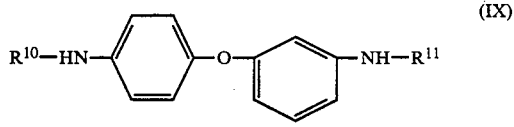

wherein $R^{10}$ and $R^{11}$ are identical or different and each represents a hydrogen atom or a lower acyl group having 1 to 3 carbon atoms in the alkyl moiety, provided that 5 to 60 mole % of the sum of and consists of hydrogen atoms.

(2) A process which comprises thermally polycondensing 1 mole of an acid component mainly comprising a member selected from the group consisting of trimellitic acid, trimellitic anhydride and a mixture of these, 0.98 to 1.02 moles of 3,4'-diaminodiphenyl ether, and 0.8 to 1.9 moles of a lower fatty acid anhydride of the following formula (X)

$$R^{12}CO\text{—}O\text{—}COR^{13} \quad (X)$$

wherein $R^{12}$ and $R^{13}$ are identical or different and each represents a lower alkyl group having 1 to 3 carbon atoms.

(3) A process which comprises
(i) forming a prepolymer having an inherent viscosity of above 0.2 by process (1) or (2) above without directly forming a polyamideimide having an inherent viscosity of above 0.48, and then
(ii) subjecting the prepolymer to solid-phase polymerization to form a polyamideimide having an inherent viscosity of above 0.48.

The polyamideimide produced by any of the processes (1) to (3) without using a plasticizing material is characteristic in that branching of its molecules is little and it gives molded articles having excellent properties.

This polyamideimide is characterized in that its melt viscosity does not become excessively high even when its inherent viscosity becomes high. Its melt viscosity, u350, is within the following range in which x is its inherent viscosity.

$$10^{3.75x+2.6} < u350 < 10^{3.75x+3.3}$$

The inherent viscosity herein is measured at 30° C. in N-methylpyrrolidone. The melt viscosity of the polymer is measured by means of a flow tester while the molten polymer is extruded from a nozzle having a diameter of 0.5 mm and a length of 1.00 mm at a temperature of 350° C. and a shear speed of 100 sec The acid component used in processes (1) to (3) comprises mainly trimellitic acid, trimellitic anhydride or a mixture of these.

A minor portion of the acid component may be, for example, a dicarboxylic acid, a tetracarboxylic acid or a tetracarboxylic acid. Specific examples of these acids are tetephthalic acid, isophthalic acid, naphthalenedicarboxylic acid, diphenyldicarboxylic acid, succinic acid, adipic acid, sebacic acid, decanedicarboxylic acid, cyclohexanedicarboxylic acid, pyromellitic acid, pyromellitic anhydride, diphenyltetracarboxylic acid, diphethyltetracarboxylic acid, benzophenonetetracarboxylic acid and benzophenonetetracarboxylic anhydride. The minor portion is used in an amount of not more than 40 mole %, preferably not more than 30 mole %, and especially preferably not more than 2 mole %.

The diamine component used in process (1) is expressed by the above formula (IX).

In formula (IX), $R^{10}$ and $R^{11}$ are identical or different and each represents a hydrogen atom or a lower acyl group having 1 to 3 carbon atoms in the alkyl moiety.

The lower alkyl moiety is, for example, methyl, ethyl, n-propyl or isopropyl. Of these, methyl is especially preferred.

In formula (IX), 5 to 60 mole % of the sum of $R^{10}$ and $R^{11}$ consists of hydrogen atoms. Thus, the proportion of the lower acyl groups is 95 to 40 mole % of the total sum of $R^{10}$ and $R^{11}$.

The diamine component used in process (1) is substantially a mixture of at least two compounds selected from 3,4'-diaminodiphenyl ether, its monoamide and its diamide.

Investigations of the present inventors have shown that the rate of reaction at which an amide is formed from an aromatic carboxylic acid and an aromatic amine is nearly equal to that at which an amide is formed from an aromatic carboxylic acid and a lower fatty acid amide of an aromatic amine, but the rate of reaction at which an imide is formed from an acid anhydride and an aromatic amine is much higher than the rate of reaction at which an imide is formed from an acid anhydride and a lower fatty acid amide and also the rate of the above amide-forming reaction; and that when the diamine is used alone, the rate of reaction is faster than in the case of using a lower fatty acid amide of the diamine alone, but in this case the resulting polymer tends to become branched because the free amine is exposed to high temperatures for a long period of time.

According to process (1) of the invention, the acid component is reacted with the diamine component using 40 to 95 mole % of the diamine component as a lower fatty acid amide and the remainder as a diamine on the basis of the above finding. Thus, the imidization reaction is carried out using the amine permitting a higher rate of the reaction. Hence, the rate of polymerization is increased and the branching of the resulting polymer is prevented.

Preferably, 10 to 55 mole %, especially 15 to 50 mole %, of the total amount of $R^{10}$ and $R^{11}$ consists of hydrogen in formula (IX) above.

Part of the diamine component used in process (1) may be replaced by another diamine and/or its lower fatty acid amide. Specific examples of the other diamine include p-phenylenediamine, m phenylenediamine, tolylenediamine, 4,4'-diaminodiphenylmethane, 4,4'diaminodiphenyl ether, 3,4'-diaminodiphenylmethane, 4,4'-diaminodiphenyl, 3,3'-dimehtyl-4,4'-diaminodiphenyl, 4,4'-diaminobenzophenone, 4,4'-diaminodiphenylsulfone, 3,3'-diaminodiphenylsulfone, ethylenediamine, tetramethylenediamine, thylenediamine. The lower fatty acid forming the lower fatty acid amide is, for example, acetic acid or propionic acid, the acetic acid being especially preferred. Preferably, the amount of the other diamine or its fatty cid amide is not more than 40 mole %, particularly not more than 30 mole %, above all not more than 20 mole %, based on the total amount of the diamine component. The proportion of the diamine component is usually substantially equimolar to that of the acid component.

In process (1) of the invention, a minor proportion of an aminocarboxylic acid such as p-aminobenzoic acid or aminobenzoic acid may be copolymerized with the acid component and the diamine component. The proportion of the aminocarboxylic acid is preferably not more than 30 %, particularly not more than 30 %, based on the entire recurring units.

Process (1) is carried out by thermally condensing the acid component and the diamine component in a molten or solid state. The reaction temperature is preferably 200° to 360° C., more preferably 220° 350° C., especially preferably 240° to 340° C. The reaction is carried out while evaporating the water or lower fatty acid formed as a result of the reaction out of the reaction system. Preferably, the reaction temperature is relatively low at the start and gradually rises as the reaction proceeds.

The atmosphere in which the reaction is carried out may be under atmospheric, elevated or reduced pressure. To remove by-products out of the reaction system, it is preferred to maintain the atmosphere under atmospheric or reduced pressure. Preferably, the reaction is carried out in an atmosphere of an inert gas such as nitrogen gas or argon gas.

There is no particular restriction on the reaction time. Preferably, it is 10 minutes to 50 hours, more preferably 10 minutes to 40 hours, especially preferably 30 minutes to 30 hours.

The process (1) thus gives a polyamideimide having an inherent viscosity, measured at 35° C. for its 1 g/dl N-methyl-2-pyrrolidone solution, of above 0.48.

Process (2) is carried out in substantially the same way as in process (1) except that 3,4'diaminodiphenyl ether and the lower fatty acid anhydride of formula (X) instead of the diamine component of formula (IX) in process (1).

In formula (X), $R^{12}$ and $R^{13}$ are identical or different and each represents a lower alkyl group having 1 to 3 carbon atoms. The lower alkyl group is methyl, ethyl, iso-propyl or n-propyl. The anhydride of formula (X) is, for example, acetic anhydride or propionic anhydride.

The amount of 3,4'-diaminodiphenyl ether used is substantially equimolar to that of the acid component. For example, it is used in an amount of 0.98 to 1.02 moles per mole of the acid component.

The lower fatty acid anhydride (X) is used in an amount of about 0.9 to 1.98 moles per mole of 3,4'diaminodiphenyl ether, or 0.9 to 1.8 moles per mole of the acid component.

It should be understood that other conditions for the thermal condensation in process (2) are substantially the same as those described above with regard to process (1).

Process (2) thus gives a polyamideimide having an inherent viscosity of above 0.48, preferably above 0.55.

By process (3) of the invention, a prepolymer having an inherent viscosity of above 0.2 is first formed by basically following the process (1) or (2) described above, and then the prepolymer is subjected to solid-phase polymerization to form a polyamideimide having an inherent viscosity of above 0.48, preferably above 0.55.

Process (3) is especially beneficial when a polymer having an inherent viscosity of above 0.48 is difficult to obtain in the first step.

According to process (3), a prepolymer having a relatively low inherent viscosity of, for example, below 0.48 obtained in the first step by melt-polymerization is then polycondensed in the solid phase in the second step to give a polymer having a higher degree of polymerization. When the solid-phase polycondensation is to be carried out following the melt polycondensation, it is preferred to perform the polycondensation in the first step until the polymer attains an inherent viscosity, measured under the above-mentioned conditions, of at least 0.2. If its inherent viscosity is less than 0.2, a long period of time is required undesirably in the solid-phase polycondensation in the second step.

To enable the molten prepolymer to be polycondensed in the solid state, it is necessary, for example, to solidify and crystallize it to a solid state so that the prepolymer does not melt or melt-adhere at the temperature at which the polycondensation reaction can proceed, for example above the glass transition temperature of the prepolymer. There is no particular limitation of the method of obtaining such a solid state. For example, there can be used a method which comprises heat-treating the molten prepolymer and thus crystallizing it (heat-treatment method), and a method which comprises reacting the molten prepolymer with a solvent and thus crystallizing it (solvent treatment method).

In the heat-treatment method, the molten prepolymer may be first solidified by cooling and then heat-treated. Alternatively, it may be successively heat-treated from the melt-polymerization step. The latter is preferred. The heat-treatment temperature at this time is preferably 250° to 330°C., more preferably about 260° to 320° C. The heat-treatment time may be one which is sufficient for the prepolymer to be crystallized. It is preferably 5 minutes to 3 hours, more preferably about 10 minutes to about 2 hours, although it may differ depending upon the heat-treatment temperature. The atmosphere in which the heat-treatment is carried out may be an atmosphere of an inert gas such as nitrogen or argon kept under atmopsheric or reduced pressure.

In the solvent-treatment method, chips of the prepolymer obtained by melt-polycondensation may be immersed in an organic solvent incapable of dissolving, but capable of swelling, the prepolymer (such as acetone, methyl ethyl ketone or dioxane) to crystallize the prepolymer. There may also be used a method in which the prepolymer obtained by the melt-polycondensation is dissolved in an organic solvent capable of dissolving the prepolymer (such as N-methyl-2-pyrrolidone or dimethylacetamide) and the prepolymer solution is subjected to reprecipitation using a solvent inccapable of dissolving the prepolymer (such as water, methanol or acetone) to thereby solidify it. The above solvent-treatment method may be combined with the heat-treatment method; for example, the prepolymer subjected to the solvent treatment is then subjected to the heat-treatment.

Consequently, the crystallized prepolyamideimide can be polycondensed in the solid phase.

The solid-phase polycondensation may be carried out at a temperature at which the polycondensation of the polymer proceeds but the melt-adhesion of the solid polymer does not occur. For example, it is preferably 250° to 330° C., more preferably about 260° to 320° C. The solid-phase polycondensation time is not particularly limited, but is preferably 30 minutes to 40 hours, more preferably 1 to 30 hours. Preferably, the atmosphere in which the solid-phase polycondensation is carried out is an atmosphere of an inert gas such as nitrogen gas or argon gas kept under atmospheric to reduced pressure. This solid-phase polycondensation gives a polymer having an inherent viscosity of above 0.48, preferably above 0.55.

In a preferred embodiment of process (3), trimellitic anhydride, 3,4'-diaminodiphenyl ether and acetic anhydride are first polycondensed in the molten state to form a prepolymer having an inherent viscosity of at least 0.2, subsequently the prepolymer is heat-treated to crystallize and solidify it, and the solid prepolymer is then polycondensed in the solid phase. Solicification of the molten prepolymer may be carriied out while allowing it to stand. Alternatively, a shearing force may be exerted by stirring, etc. so that simultaneously with solidification, the prepolymer is pulverized into a powder or granules. In this preferred embodiment, a polyamideimide of a high degree of polymerization with little branching can be obtained very efficiently by a series of steps of melt-polycondensation, heat-treatment and solid-phase polycondensation without using a plasticizing material.

The polyamideimide used in this invention can be one which when undergoing heat-treatment after shaping, locally permits introduction of a crosslinked structure. Introduction of a crosslinked structure increases the heat resistance of the polymer in use. The easiest and most effective method of introducing such a crosslinked structure is to add an aromatic triamine or tetramine to the reaction mixture in the final stage of the polymerization reaction or to the resulting polymer, shape the polymer in the non-crosslinked state and heat-treat the shaped product thereby to introduce a crosslinked structure by reaction with the terminal groups.

Examples of such a triamine or tetramine are 2,4,4'-triaminodiphenyl ether, 1,3,5- or 1,2,4triaminobenzene, and 3,3',4,4'-tetraminodiphenyl ether.

On the other hand, it is possible to use trifunctional or higher polycarboxylic acids e.g., trimesic acid or its derivatives) for the aromatic amino groups as a crosslinking agent.

Conversely, if the reactive amino groups of the polymer are blocked by adding a highly reactive monofunctional compound such as a monoaryl carboxylate (e.g., phenyl benzoate), N-benzoyl caprolactone, or a dicarboxylic acid anhydride (e.g., phthalic anhydride) in the last stage of polymerization or during the molding of the polymer, the thermal stability of the polymer can be increased while inhibiting coloration.

The polyamideimide of this invention may be used in a wide range of applications, for example as a varnish, an adhesive, a film, fibers, a matrix resin for fiber-reinforced composite materials, and a molding resin for compression molding, extrusion, injectin molding, etc.

As a varnish, the polyamideimide is used in the form of a solution in N-methylpyrrolidone or cresol as a main solvent as an enamelling varnish for wires and cables, and as an enamel for aluminum utensils. The polymer in powder form may be used for coating a metallic surface by applying the powdery polymer to the surface and then baking it.

Films and fibers may be shaped from a solution of the polymer by the wet or dry method. They can be used for electrical insulation and as protective apparel by utilizing the good heat resistance and fire retardancy of the polymer.

As an adhesive, the polyamideimide may be used as a dry film adhesive, or as a solution adhesive to be coated on an adhrend, dried and then thermally melt-bonded. The adherend may, for example, be metals, especially iron, aluminum, stainless steel and copper.

When the polyamideimide is used as a matrix resin for fiber-reinforced composite materials, the polymer in the form of a solution or a powder fluidized layer is applied to the surface of reinforcing fibers to form strands, unidirectional prepregs, etc, and molded articles can be obtained from them by various techniques such as autoclave molding, press-forming, or filament winding.

As a molding resin, molding compounds are prepared together with various additives, and shaped by compression molding, extrusion, injection molding, etc.

The molded articles described above have a well balanced combination of heat resistance, mechanical properties and chemical resistance, and can be widely used in advanced technological fields as functional component parts of various transporting machines such as aircraft, spacecraft, automobiles and ships, electrical, electronic and automation instruments and appliances and sporting goods.

In actual applications, the polymers may be used as blends with various additives and other polymers.

The following Examples illustrate the present invention more specifically. It should be understood that these examples are merely illustrative and do not limit the invention.

EXAMPLE 1

A reactor equipped with a stirrer, a nitrogen gas introducing opening and a distillation opening was charged with 20.0 g of 3,4'-diaminodiphenyl ether, 19.2 g of trimellitic anhydride, 0.2 g of triphenyl phosphate, and 15.3 g of diphenylsulfone. After purging the inside of the reactor well with nitrogen, the reaction was carried out at 280° C. for 2 hours in a stream of nitrogen gas while water formed was distilled out of the reaction system. The resulting composition was transparent. The composition was then pulverized to a size of 10 to 20 mesh, immersed in acetone and extracted under heat. The resulting polymer had an inherent visosity, measured at 30° C. in N-methylpyrrolidone in a concentration of 0.5 g/dl, of 0.64.

COMPARATIVE EXAMPLE 1

The same reaction as in Example 1 was carried out except that 4,4'-diaminodiphenyl ether was used instead of 3,4'-diaminodiphenyl ether. In about 30 minutes after the start of the reaction, the reaction system solidified and became unable to be stirred uniformly.

EXAMPLES 2–5

Example 1 was repeated except that a predetermined amount of each of the compounds shown in Table 1 below was used instead of 15.3 g of diphenylsulfone, and the reaction was carried out under the reaction conditions shown in Table 1. The resulting compositions were transparent. The compositions were each extracted with acetone in the same way as in Example 1, and the resulting polymers had the inherent viscosities shown in Table 1.

TABLE 1

| Example | Low-molecular-weight compound (amount added) | Reaction conditions Temp. (°C.) | Time (hrs) | $\eta_{inh}$ |
|---|---|---|---|---|
| 2 | Diphenylsulfone (8.9 g) | 290 | 2 | 0.63 |
| 3 | Diphenylsulfone (24.0 g) | 280 | 7 | 0.68 |
| 4 | 4,4'-bis-(p-phenylphenoxy)diphenylsulfone (15.3 g) | 290 | 2 | 0.61 |
| 5 | 4,4'-Diphenoxydiphenylsulfone (15.3 g) | 280 | 3 | 0.66 |

EXAMPLES 6 AND 7

The same reactor as used in Example 1 was charged with the material shown in Table 2 15.3 g of diphenylsulfone and 0.5 g of triphenyl phosphite, and the same reaction and extraction as in Example 1 were carried out. The intrinsic viscosities of the resulting polymers are shown in Table 2.

TABLE 2

| Example | Materials | $\eta_{inh}$ |
|---|---|---|
| 6 | 3,4'-diaminodiphenylether (16.0 g) m-phenylenediamine (2.2 g) trimellitic anhydride (19.2 g) | 0.48 |
| 7 | 3,4'-diaminodiphenyl ether (20.0 g) trimellitic anhydride (17.3 g) diphenyl isophthalate (3.2 g) | 0.62 |

EXAMPLE 8

The same reactor as in Example 1 was charged with 20.0 g of 3,4'-diaminodiphenyl ether, 19.0 g of trimellitic anhydride, 23.7 g of diphenylsulfone and 0.2 g of triphenyl phosphite, and they were reacted at 270° C. for 1 hour in a stream of nitrogen gas. At this point, part of the polymer composition was sampled and extracted, and its inherent viscosity was measured. It was 0.29. Then, 2 g of N,N'-terephthaloyl biscaprolactam was added, and the mixture was reacted for 30 minutes. After the extracting treatment, the polymer had an inherent viscosity of 0.67.

EXAMPLE 9

The same polyamideimide (inherent viscosity 0.61) as obtained in Example 1 and a mixture of the polyamideimide with 30 % by weight of glass fibers were each injection-molded at a cylinder temperature of 280° to 310° C. and a mold temperature of 165° C. The resulting molded articles had the properties shwon in Table 3.

TABLE 3

| Property | Polyamideimide alone | Mixture of the polyamideimide and glass fibers |
|---|---|---|
| Tensile strength (kg/cm$^2$) | 720 | 1130 |
| Elongation at break (%) | 4.7 | 3.0 |
| Flexural strength (kg/cm$^2$) | 1150 | 1520 |
| Flexural modulus (kg/cm$^2$) | 41000 | 100000 |
| Heat distortion temperature (°C.) | 208 | 221 |

In the following examples, all parts are by weight. The inherent viscosities wer measured under the conditions described in the specification. The glass transition temperatures (Tg) and melting points (Tm) were measured by using a differential scanning calorimeter at a temperature elevation rate of 10° C./min.

EXAMPLE 10

Trimellitic anhydride (192 parts), 200 parts of 3,4'-diaminodiphenyl ether and 143 parts of acetic anhydride were put in a reaction vessel equipped with a stirrer and a distillation system. In a stream of nitrogen, the materials were heated from 200° C. to 300° C. with stirring over the course of about 90 minutes under atmospheric pressure, and acetic acid formed was distilled out. Then, over the course of 15 minutes, the inside of the reactor was reduced in pressure to about 10 mmHg, and then to less than 1 mmHg at the above temperature. During the melt-reaction, the viscosity of the polymer gradually increased. The reaction under high vacuum was carried out at 300° C. for 10 minutes (by which the inherent viscosity reached 0.29). The stirring was stopped, and the reaction mixture was heat-treated further for 30 minutes, whereupon the brown transparent molten polymer gradually solidified to a pale brown non-transparent mass. Subsequently, the solid polymer was polycondensed in the solid phase at 300° C. and less than 1 mmHg for 120 minutes to give a polymer having an inherent viscosity of 0.56 and a Tg of 240° C. A Tm of 325° C. was observed in the resulting polymer.

The polymer had a melt viscosity ($\mu 325$) of 118,000.

The polymer was extruded at 350° C. from a nozzle having a diameter of 0.1 mm and a length of 1.0 mm of a Koka-type flow tester to form a monofilament. The resulting monofilament was brown and transparent and very tough. When the monofilament was subjected to DSC measurement, it had a Tg of 242° C., but its Tm was no longer observed.

EXAMPLE 11

Trimellitic anhydride (192 parts), 170 parts of 3,4'-diacetamidediphenyl ether and 80 parts of 3,4'-diaminodiphenyl ether were put in the same reactor as in Example 10, and melted at 240° C. under atmospheric pressure in a stream of nitrogen. The mixture was heated to 320° C. in the course of about 80 minutes, and acetic acid formed was evaporated.

Then, the pressure of the inside of the reactor was gradually reduced to about 10 mmHg over 20 minutes. The polymer became a brown transparent highly viscous molten mass (the inherent viscosity of the polymer was 0.33). The stirring was then stopped, and the pressure was reduced to about 1 mmHg at 320° C., and the mixture was heat-treated for 30 minutes. The molten polymer gradually solidified to a pale brown non-transparent mass. The solidified polymer was polycondensed in the solid phase for 100 minutes under the same pressure and temperature conditions as above. The polymer had a melt viscosity ($\mu 350$) of 260,000, an inherent viscosity of 0.65, and a Tg of 243° C. Tm was observed at 325° C.

EXAMPLE 12

Trimellitic anhydride (192 parts), 200 parts of 3,4'-diaminodiphenyl ether and 120 parts of acetic anhydride were put in the same reactor as in Example 10. In a nitrogen stream, these materials were melted with stirring at 200° C. under atmospheric pressure. Over about 60 minutes, the temperature was elevated to 280° C., and at this temperature, the pressure was gradually reduced from atmospheric pressure to about 10 mmHg over the course of 55 minutes. treated under a high vacuum of les than 1 mmHg for 40 minutes at the above temperature. As a result, the polymer solidified. The stirring was stopped at this time when the high-vacuum reaction proceeded for abut 5 minutes. The resulting polymer had an inherent viscosity of 0.33. The polymer was taken out from the reactor and pulverized to a particle diameter of 10 to 20 mesh. The pulverized polymer was put in a reactor equipped with a stirrer and a vacuum distillation device, and with stirring, reacted under a high vacuum of 0.6 mmHg for 2 hours at 280° C. and then for 8 hours at 300° C. A polymer was obtained which had an inherent viscosity of 0.68 and a melt viscosity ($\mu 350$) of 365,000. During the solid-phase polycondensation, the solid polymer did not melt nor melt-adhere and could be stirred.

EXAMPLE 13

Trimellitic anhydride (192 parts), 200 parts of 3,4'-diaminodiphenyl ether, 115 parts of acetic anhydride and 150 parts of 4,4'-diphenyldiphenylsulfone were put in a reactor equipped with a stirrer and a vacuum distilation system. In a stream of nitrogen under atmospheric pressure, the materials were maintained at 240° C. for 30 minutes, and then the temperature of the mixture was raised to 330° C. over the course of about 60 minutes. Water and acetic acid formed were distilled off. Then, at 330° C., the pressure of the reaction system was gradually reduced to about 10 mmHg over 15 minutes, and further to less than 1 mmHg. The polycondensation was carried out under less than 1 mmHg for 2.5 hours at the above temperature. The resulting polymer was a uniform brown transparent molten mass.

The polymer was cut to chips and immersed in circulating dioxane to extract 4,4'-diphenyldiphenylsulfone. There was obtained a polymer having an inherent viscosity of 0.69 and a melt viscosity of 380,000.

EXAMPLE 14

Trimellitic anhydride (192 parts), 200 parts of 3,4'-diaminodiphenyl ether, 150 parts of acetic anhydride and 2.6 parts of tripenylphosphine were put in a reactor equipped with a stirrer and a vacuum distillation system, and thermally polycondensed at 250° C. for 30 minutes in a stream of nitrogen. Then, the temperature was raised to 340° C. over the course of about 60 minutes. After the temperature elevation, the pressure of the reaction system was gradually reduced to 10 mmHg over about 15 minutes, and then to a high vacuum of 0.5 mmHg. The polycondensation reaction in the molten state was then carried out for 90 minutes.

After the above polycondensation, the pressure of the reaction system was gradually reduced to 10 mmHg over about 15 minutes, and then to a high vacuum of 0.5 mmHg. The melt-polycondensation was then carried out for 90 minutes.

After the above polycondensation, the molten polymer gradually increased in viscosity, and water and acetic cid formed were distilled out. The resulting polymer had an inherent viscosity of 0.59, a Tg of 242° C. and a melt viscosity of 175,000.

EXAMPLE 15

The polymer obtained in Example 11 was dried in hot air at 150° C. for 4 hours, and then injection-molded at a barrel temperature of 370° C. and a mold temperature of 100° C. with a molding cycle time of about 2.5 minutes. The resulting molded article was brown and transparent and had the properties shown in Table 4.

When the polymer was immersed in acetone, methanol, xylene and trichloroethylene, respectively, for 10 days at room temperature, it was not dissolved nor swollen, but showed excellent solvent resistance.

Table 4

Tensile strength: 980 kg/cm$^2$
Tensile modulus: 24300 kg/cm$^2$
Elongation at break: 12 %
Fleuxural strength: 1960 kg/cm$^2$
Flexural modulus: 35500 kg/cm$^2$
Impact strength (Izod, notched 1/4'): 1.2 kg-cm/cm$^2$
Heat distortion temperature (18.6 kg/cm2) 220° C.

We claim:

1. An intimate mixture comprising
(A) a polyamideimide comprising a unit of the following formula (II)

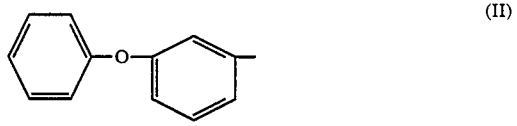

and a unit of the following formula (IV)

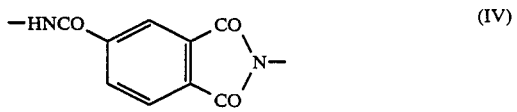

as main units forming the molecular chains of the polyamideimide, said polyamideimide having an inherent viscosity ($\eta_{inh}$) measured at 30° C. in N-methylpyrrolidone, of above 0.48, and
(B) a plasticizing material for the polyamideimide (A), said plasticizing material for the poly amideimide(A) being a diphenyl compound represented by the following formula

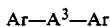

wherein $A^3$ is —O—, —SO$_2$, —CO— or an alkylene group, and
Ar is an aromatic radical.

2. The intimate mixture of claim 1 wherein the total proportion of the unit of formula (IV) and the unit of formula (II) is at least 50% based on the entire units forming the molecular chains of the polyamideimide.

3. The intimate mixture of claim 1 wherein the proportion of the unit of formula (IV) and the unit of formula (II) directly bonded to each other is at least 50% of the total proportion of the unit of formula (IV) and the unit of formula (II).

4. The intimate mixture of claim 1 wherein the total proportion of the unit of formula (IV) and the unit of formula (II) directly bonded to each other is at least based on the entire units forming the molecular chains of the polyamideimide.

5. The intimate mixture of claim 1 wherein the polyamideimide further comprises at least one unit selected from the group consisting of a unit represented by the following formula (V)

—HNCO—Ar¹—CONH—Ar²— (V)

wherein Ar¹ and Ar² are identical or different and each represents a divalent aromatic group having 6 to 20 carbon atoms, a unit represented by the following formula (VI)

—Ar³—CONH— (VI)

whrein Ar³ is the same as defined for Ar¹, a unit represented by the following formula (VII)

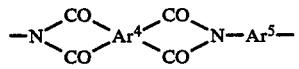 (VII)

wherein Ar⁴ represents a tetravalent aromatic group having 6 to 20 carbon atoms, and Ar⁵ is the same as Ar¹, and a unit represented by the following formula (VIII)

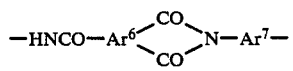 (VIII)

wherein Ar⁶ represents an aromatic group having 6 to 20 carbon atoms, and Ar⁷ is the same as defined for Ar¹, provided that Ar⁷ is not a 3,4'-diphenyl ether group, the proportion of said at least one unit being smaller than the total proportion of the unit of (IV) and the unit of formula (II).

6. The intimate mixture of claim 1 wherein the plasticizing material for the polyamideimide is a low-molecular-weight diphenyl compound which has a boiling point of at least 300° C. and a molecular weight of not more than 1000 and which is compatible, but substantially non-reactive, with the polyamideimide.

7. The intimate mixture of claim 1 wherein the proportion of the polyamideimide (A) is 40 to 90 % by weight based on the total amount of the polyamideimide (A) and the plasticizing material (B).

8. The intimate mixture of claim 1 wherein said polyamideimide has an inherent viscosity ($\eta_{inh}$) of 0.5 to 1.5.

9. A process for preparing an intimate mixture of a polyamideimide and a plasticizing material, said process comprising thermally condensing an acid component, mainly comprising a member selected from the group consisting of trimellitic acid, trimellitic anhydride and mixtures thereof, with a diamine component, mainly comprising a member selected from the group consisting of 3,4'-diaminodiphenyl ether, a lower aliphatic carboxylic acid amide of 3,4'-diaminodiphenyl ether and mixture thereof, in the presence of a diphenyl compound represented by the following formula Ar—A³—Ar wherein A³ is —O-13 , —SO₂—, —CO— or an alkylene group, and Ar is an aromatic radical, to form an intimate mixture comprising (A) a polyamideimide comprising a unit of the following formula (II)

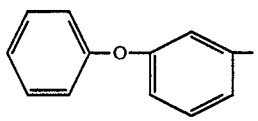 (II)

and a unit of the following formula (IV)

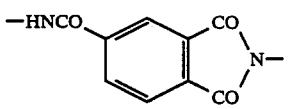 (IV)

as main units forming the molecular chains of the polyamideimide, said polyamideimide having an inherent viscosity ($\eta_{inh}$), measured at 30° C. in N-methylpyrrolidone, 0.48, and (B) a plasticizing material for the polyamideimide (A), said plasticising material for the polyamideimide (A) being a diphenyl compound represented by the following formula Ar—A³—Ar wherein A³ is —O—, —SO₂—, —CO— or an alkylene group, and Ar is an aromatic radical.

10. An intimate mixture comprising
(A) a polyamideimide comprising a unit of the following formula (II)

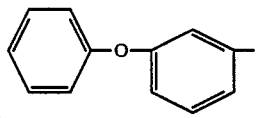 (II)

and a unit of the following formula (IV)

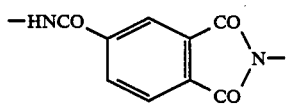 (IV)

as main units forming the molecular chains of the polyamideimide, said polyamideimide having an inherent viscosity ($\eta_{inh}$) measured at 30° C. in N-methylpyrrolidone, of above 0.48, and (B) a plasticizing material for the polyamideimide (A), said plasticising material for the polyamideimide (A) being a diphenyl compound represented by the following formula Ar—SO₂—Ar wherein Ar is an aromatic radical.

* * * * *

UNITED STATES PATENT AND TRADEMARK OFFICE
CERTIFICATE OF CORRECTION

PATENT NO. : 4,902,740

DATED : February 20, 1990

INVENTOR(S) : Shigeyoshi Hara and Hiroo Inata

It is certified that error appears in the above-identified patent and that said Letters Patent is hereby corrected as shown below:

On the title page, in item [75], delete the third named inventor, "Shunichi Matsumura".
Column 16, lines 25-26:
Claim 1, line 4, delete the formula and insert therefor

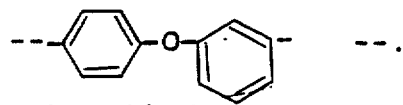 --.

Column 16, line 63:
Claim 4, line 3, after "least", insert --50%--.
Column 17, line 59:
Claim 9, line 13, delete "-O-13", insert -- -O- --;
Column 18, lines 5-8:
Claim 9, line 18, delete the formula and insert therefor

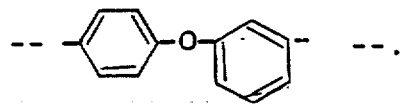 --.

UNITED STATES PATENT AND TRADEMARK OFFICE
CERTIFICATE OF CORRECTION

PATENT NO. : 4,902,740

DATED : February 20, 1990

INVENTOR(S) : Shigeyoshi Hara and Hiroo Inata

It is certified that error appears in the above-identified patent and that said Letters Patent is hereby corrected as shown below:

Column 18, lines 36-39:
Claim 10, line 4, delete the formula and insert therefor

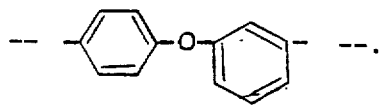

Signed and Sealed this

Nineteenth Day of May, 1992

Attest:

DOUGLAS B. COMER

Attesting Officer       Acting Commissioner of Patents and Trademarks